United States Patent [19]
Mohr et al.

[11] Patent Number: 5,321,358
[45] Date of Patent: Jun. 14, 1994

[54] EMBEDDED NMR SENSORS FOR CURE MONITORING AND CONTROL OF COMPOSITE STRUCTURES

[75] Inventors: Gregory A. Mohr, Scotia; Michael K. Cueman, Niskayuna, both of N.Y.; Mark S. Conradi, University City, Mo.

[73] Assignee: General Electric Company, Schenectady, N.Y.

[21] Appl. No.: 24,136

[22] Filed: Mar. 1, 1993

[51] Int. Cl.$^5$ .............................................. G01V 3/00
[52] U.S. Cl. ...................................... 324/300; 324/307
[58] Field of Search ............... 324/300, 307, 308, 309, 324/318, 322; 73/866.5

[56] References Cited

U.S. PATENT DOCUMENTS

| | | | |
|---|---|---|---|
| 4,386,319 | 5/1983 | McGinniss | 324/300 |
| 4,532,218 | 7/1985 | Strom | 324/300 |
| 4,677,382 | 6/1987 | Vatis | 324/307 |
| 4,680,547 | 7/1987 | Leue et al. | 324/309 |
| 4,921,415 | 5/1990 | Thomas, III et al. | 425/135 |

FOREIGN PATENT DOCUMENTS

| | | | |
|---|---|---|---|
| 58-150846 | 9/1983 | Japan | 324/300 |
| 2043262 | 10/1980 | United Kingdom | 324/300 |

OTHER PUBLICATIONS

American Physical Society, Abstract Submitted for 1991 March Meeting, Suggested Session Title: Polymers (no month).

Primary Examiner—Louis Arana
Attorney, Agent, or Firm—Paul R. Webb, II

[57] ABSTRACT

Methods and apparatus for monitoring and controlling cure cycles of composite structures utilize specialized NMR sensor (14) embedded into critical regions in the interior of composite structures (18) to provide in-situ cure state information. Signals developed by the NMR sensors (14) during the curing cycle are processed by an NMR spectrometer (30) to determine selected NMR parameters including $T_1$, $T_2$, $T_{1D}$, and $T_2^*$ of the materials in the vicinity of the sensor, from which the rigidity of the materials are deduced. Experimental data show clear trends in values of particular NMR parameters taken as time series during cure cycles. Cure cycle control is accomplished using output data from an enhanced NMR spectrometer (30*) to drive temperature and pressure controllers (38, 42) of a curing oven (20*) for real time process control.

38 Claims, 6 Drawing Sheets

EMBEDDED NMR SENSORS FOR CURE MONITORING AND CONTROL OF COMPOSITE STRUCTURES

TECHNICAL FIELD

The present invention relates generally to monitoring and controlling the cure cycle of composite structures during their manufacture and, more particularly, to the use of NMR (nuclear magnetic resonance) sensors embedded during the lay-up of the composite structures to provide a nondestructive method for assuring the quality of the finished cured assemblies.

BACKGROUND OF THE INVENTION

Conventional composite structures are typically made by laminating many layers of "pre-preg", which contain reinforcing fibers surrounded by a matrix impregnated with a resinous binder substance, thereby building up the shape desired for the final structure. One common type of composite, consisting of an epoxy matrix reinforced by many small diameter graphite fibers, is called graphite reinforced epoxy (GRE). Another uses a specialized binder substance called PMR-15 as its matrix.

A complex cycle of curing the binder substance at elevated temperatures and pressures is required to transform the layered structure into a rigid assembly. the binder must first liquify and flow to penetrate all of the fiber layers, then solidify into a uniform matrix around the reinforcing fibers. Various combinations of pressure and temperature must be used during the cure cycle to compensate for changes in the viscosity of the binder. Small deviations from the desired cycle can result in a variety of defects in the finished part, such as delamination of adjacent layers or entrapment within the matrix of small bubbles of gas generated by the curing reaction. These defects result in an unfavorable reduction in the mechanical performance of the finished assembly. An in-situ nondestructive technique for carefully monitoring the progress of the cure cycle is therefore very desirable.

Attempts to overcome some of the difficulties encountered with the complex curing cycles called for with these materials include the use of thermocouples to monitor temperatures during the cure cycle, but this method provides only indirect information about the progress of the transformation from flexibility to rigidity. Capacitive sensors that infer rigidity from changes in the dielectric polarizability of the binder have met with only limited success in current manufacturing applications.

In U.S. Pat. No. 4,921,415 to Thomas, III et al., assigned to the same assignee as the present invention, there is disclosed apparatus for monitoring the curing of fiber reinforced composite plastic that is cured at temperatures on the order of 350° C., based on the utilization of an ultrasonic transducer assembly.

The embedded NMR sensor approach as taught in the present invention admirable overcomes many of the problems of cure cycle monitoring and control experienced with such prior art techniques. Due to its in-situ cure state sensing capabilities and its compatibility with existing NMR spectrometer techniques, it provides a significant improvement to the field of cure monitoring the control of composite structures.

OBJECTS OF THE INVENTION

It is therefore a primary object of the present invention to provide improved methods for cure cycle monitoring and control of composite structures that will overcome the disadvantages of prior art approaches.

An additional object of the present invention is to provide improved apparatus for practicing the method of the present invention.

A further object of the present invention is to provide apparatus for controlling the cure cycle of composite structures based on the sensing and processing of the NMR parameters as derived from NMR sensors embedded within the composite structure.

A still further object of the present invention is to provide a nondestructive method of monitoring the cure cycle of a composite structure wherein NMR sensors embedded in the interior of the structure during its lay-up provide signals related to the degree of rigidity of the materials within the structure, from which cure state information is deduced by measurements of NMR parameters exhibited by the materials.

In accordance with the present invention, there is disclosed methods and apparatus of cure cycle monitoring and control during the manufacture of composite structures containing layers of reinforcing fibers surrounded by a matrix impregnated with a resinous binder substance, wherein uniquely formed NMR sensor coils are positioned so as to be embedded between the layers for providing instantaneous cure state information. The information is derived by processing the signals available via the embedded sensors using conventional NMR spectrometers. By measurement of selected NMR parameters, including dipole spin-lattice relaxation time $T_{1D}$ and time constant $T_2^*$, as well as the well-known $T_1$ and $T_2$ relaxation times, physical characteristics representative of the cure state of the materials in the vicinity of the sensing coils are deduced. By virtue of appropriate feedback control techniques using the NMR-derived cure state information, precise process control of the cure cycle may additionally be achieved.

BRIEF DESCRIPTION OF THE DRAWINGS

Additional objects and advantages of the invention will become apparent to those skilled in the art as the description proceeds with reference to the accompanying drawings wherein.

BEST MODE FOR CARRYING OUT THE INVENTION

Figure 1:
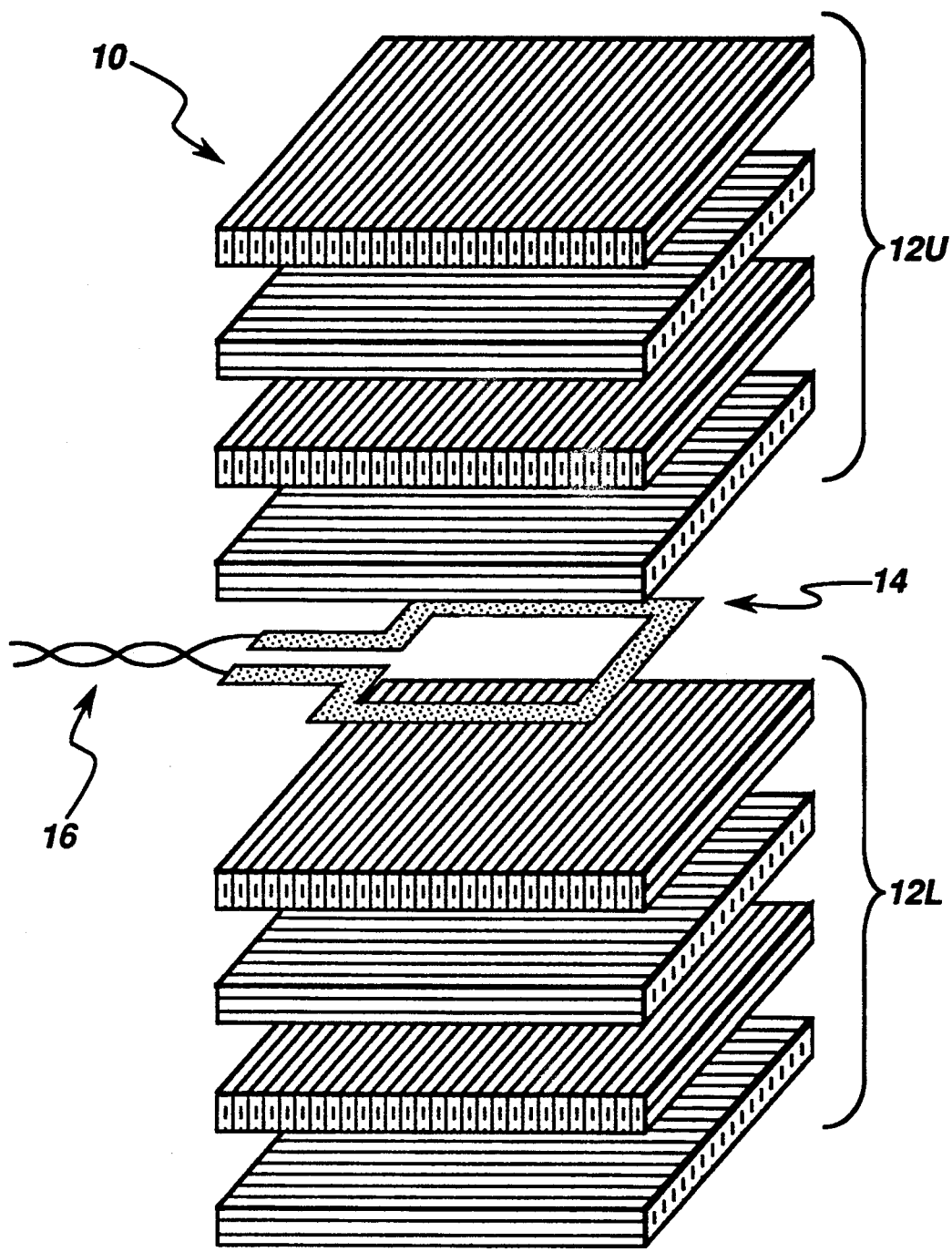
FIG. 1 is an assembly view of a simple composite lay-up showing layers of pre-preg with an embedded NMR sensor included between two of the layers.

Referring now to FIG. 1, there is shown a simple composite lay-up assembly having layers of pre-preg with an NMR sensor positioned to be embedded between two of the layers, according to the present invention. The lay-up assembly 10 includes a plurality of upper layers 12U and a plurality of lower layers 12L, both with alternately disposed fiber orientations. Conventionally, the individual pre-preg layers contain reinforcing fibers surrounded by a matrix impregnated with a resinous binder substance. During the lay-up process, a flat sensor coil 14 of conductive wire or ribbon is placed between the upper and lower pre-preg layers in the interior of the assembly, and a pair of electrical leads 16 extending from the sensor coil 14 carries signals to the exterior of the assembly. The sensor coil 14 includes a coating of high-temperature insulation (not shown), and during the curing reaction of the binder from the surrounding layers flows to encapsulate the sensor, which remains in the finished part.

Figure 2A:
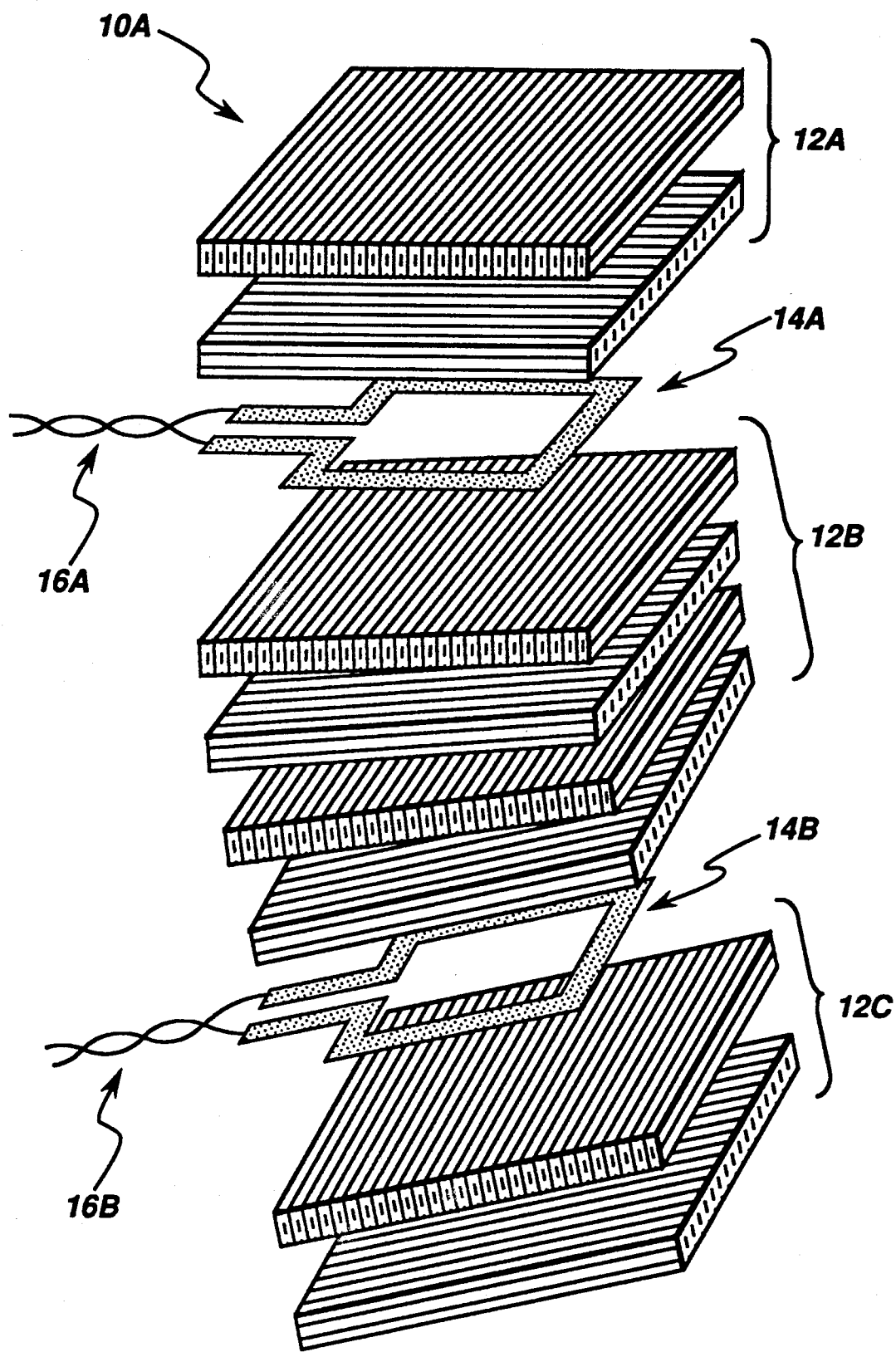
FIG. 2A is an assembly view of a composite lay-up of compound shape including a plurality of embedded NMR sensors.

Beyond the lay-up assembly shown for simplicity in FIG. 1 as being planar, the composite lay-up often is contoured to build up a desired compound shape for a finished composite structure or part. Brief reference to FIG. 2A shows a somewhat more complex lay-up assembly illustrative of finished composite structures of compound shape. The lay-up assembly 10A shows the use of a plurality of sensors wherein the sensors may be displaced both vertically and horizontally from each other, as required. As shown, sensor 14A is placed between layers 12A and 12B and is accessible via leads 16A. A second sensor 14B is similarly disposed between layers 12B and 12C. Other configurations are, of course, contemplated.

Figure 2B:
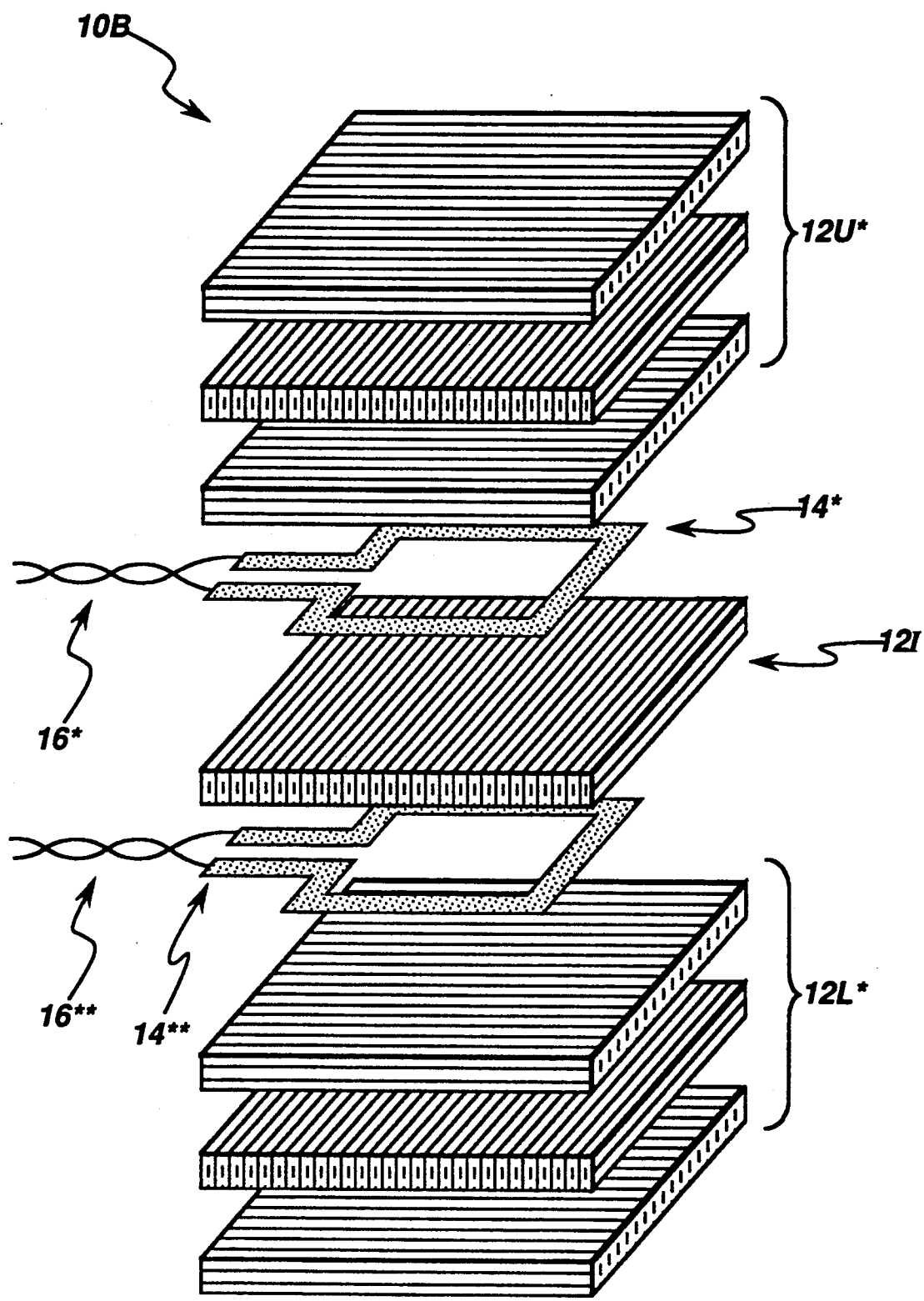
FIG. 2B is an assembly view of a composite lay-up showing an embedded NMR coil pair.

Brief reference to FIG. 2B shows an alternate embodiment of the basic sensor coil approach of FIG. 1, as adapted for use with alternate types of associated instrumentation. The purposes of these alternates are described hereinbelow. As shown in the lay-up assembly 10B, a cooperating pair of flat coils 14* and 14** are placed between upper and lower layers 12U* and 12L* as before, and they may include one or more intermediate layers 12I* between them. In use, the pairs of coils 14* and 14** may serve as an interactive pair of transmit/receive elements, as required with particular types of associated instrumentation.

In addition to the two alternate embodiments shown—the spatially distributed plurality of NMR sensor coils of FIG. 2A and the interactive transmit/receive pair of coils of FIG. 2B—combinations of these variants, and others, are contemplated for use in the present invention. In all embodiments, the flat coil remains within the cured finished composite structure. For simplicity of exposition, the various NMR coils of FIGS. 1, 2A, and 2B are shown as having a single turn, and the coil pairs of FIG. 2B are shown as being coaxial. Other coil geometries (flat spirals and the like) are contemplated for use in the present invention, and relative coil orientations other than coaxial are contemplated for use as the transmit/receive coil pairs.

Figure 3:
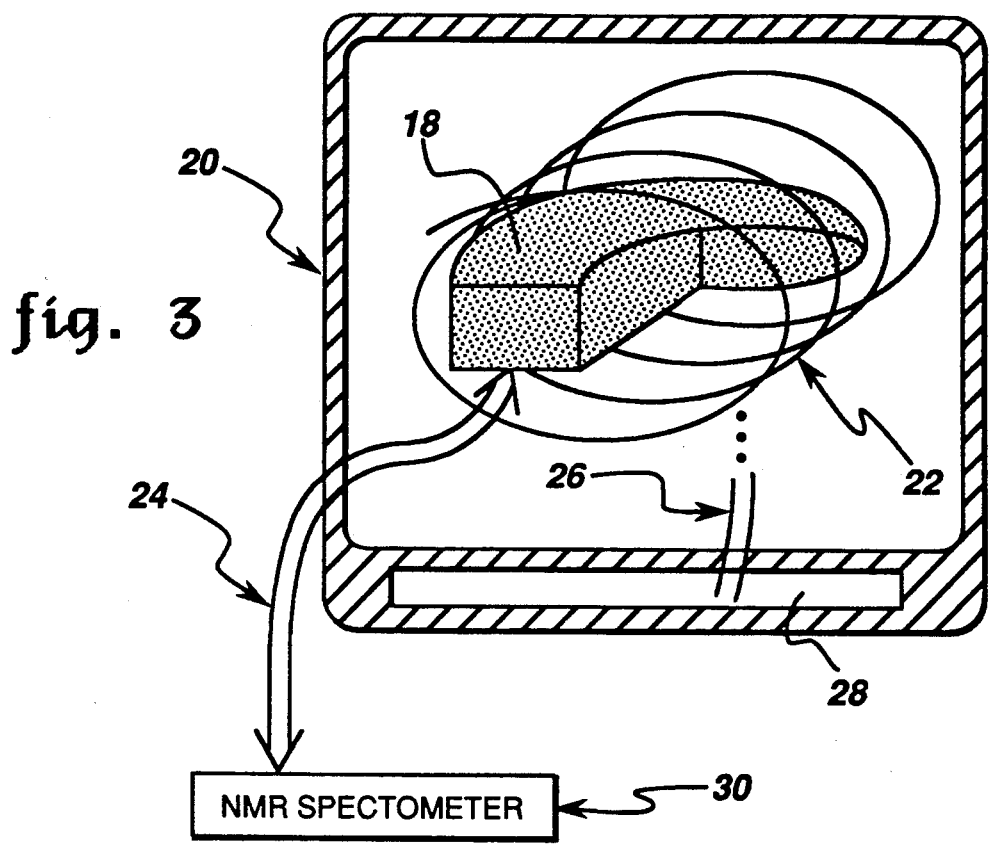
FIG. 3 is a schematic diagram of in-site monitoring of a cure cycle according to the method of the present invention.
Figure 8:
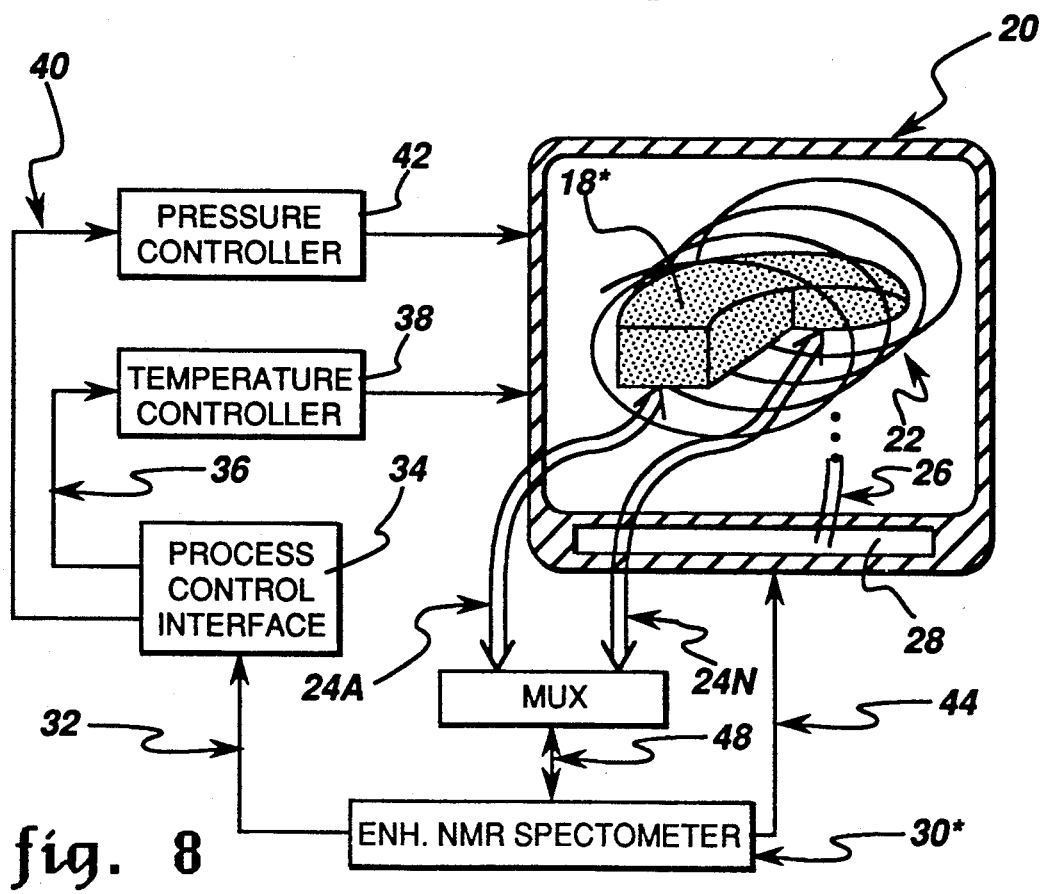
FIG. 8 is a schematic diagram of an enhanced cure cycle monitoring and control system utilizing the methods of the present invention.

Referring now to FIG. 3, there is shown a schematic diagram of in-situ monitoring of a composite structure cure cycle using an embedded NMR sensor. A lay-up assembly 18 of intermediate completion is placed in a curing oven 20 that includes current carrying coils 22 for producing a predetermined magnetic field throughout the volume of interest. The assembly 18 is in near final physical form, has one or more NMR coils (not shown) embedded in it, and is initially in its uncured state. Electrical leads 24 are connected to the NMR coils, and field current leads 26 carry the current to produce the desired static field intensity within the over 20 via field control circuitry 28.

Since the NMR sensitive region surrounding any particular sensor is relatively small, the demanding requirement for an extremely uniform applied external magnetic field across the entire sample can be relaxed well below the standards typically required for conventional high resolution NMR, or its usual application to magnetic resonance imaging (MRI). The electrical leads 24 are routed through the curing oven walls, using well-known feed through means to an NMR spectrometer 30 allowing cure monitoring using standard CW, pulsed, or related NMR techniques. These techniques can readily monitor the degree of rigidity of many common binder substances. The rates at which individual molecules move or reorient strongly depend on the coupling strengths between the molecules, i.e., on the rigidity of the material, and these rates in turn affect the NMR parameters of interest, such as $T_{1D}$, $T_2^*$, $T_1$, and $T_2$. However, the electrical conductivity of many composites (especially the technologically important class of composites reinforced with graphite fibers) severely limits the depth into the composite that can be probed using conventional external NMR sensors. Hence, by embedding the specialized NMR sensors or NMR coil pairs into critical regions of the assembly during lay-up, the curing cycle can be monitored directly in the volume immediately surrounding each sensor. This allows in-situ process monitoring and thereby yields increased productivity and enhanced performance of the resulting composite structure.

For instance, the rigidity of the binder in the vicinity of the sensing coil can be deduced from measurement of $T_2$ and/or $T_2^*$ relaxation times. By applying pulses of RF energy to the sensing coil, or to one of a coil pair, using standard NMR pulse sequences, nuclear spins of a particular species in the binder (such as hydrogen) can be excited to produce a net macroscopic magnetization perpendicular to the external static field. The net magnetization processes about the direction of the external field at a characteristic frequency that is proportional to the magnitude of the magnetic field at the position of the nucleus, and the magnitude of this magnetization decays as the excitation energy is redistributed in the material and eventually dissipated. By observing the resulting electrical signals induced in the sensor coil, the relaxation times characteristic of the redistribution can be monitored and the rigidity of the material inferred.

Some experimental evidence will serve to particularize these general notions. Consider one NMR parameter sensitive to the cure state of epoxy systems, the transverse relaxation time, $T_2$. When the epoxy is wet and liquid, a given nuclear spin samples a variety of local fields, because the molecule bearing the spin both rotates and diffuses. The effect of this motional averaging is that the spin sees a more uniform field (on average) and, hence, the transverse magnetization takes longer to dephase leading to a longer $T_2$. As the epoxy cures, the motions of the molecules become increasingly restricted in amplitude, due to the new constraints imposed by the newly formed bonds. The activation energies for large-amplitude motions increase, decreasing the rate at which such motions occur. The motional averaging is reduced, resulting in a shorter relaxation time $T_2$. Ultimately, as the material becomes more rigid and the motions are sufficiently reduced in rate, the $T_2$ reaches a constant value known as the rigid lattice limit. In this regime, the motions of the molecules have become so slow that the spins dephase before substantial motion occurs—the motions are slow on the time scale of $T_2$ and no longer influence $T_2$. For most organic solids, the rigid lattice values of $T_2$ is around 10-30 $\mu s$, reflecting simply the density of nuclear spins (protons). Experimentally, it is useful to measure the closely related relaxation time $T_2^*$. This is the length of time required for the NMR free induction signal to decay to $1/e$ of its initial amplitude. In low viscosity liquids where $T_2$ is quite long, the value of $T_2^*$ is limited by the external magnetic field inhomogeneity. For more viscous and solid materials (short $T_2$), the times $T_2$ and $T_2^*$ are equal. In general, epoxy systems are quite viscous, so $T_2^*$ is a good measure of $T_2$.

Another NMR relaxation time that is sensitive to molecular motions is the relaxation time for dipolar order, $T_{1D}$. The unique feature of $T_{1D}$ is that it is sensitive to ultra-slow motions. That is, as a material becomes so viscous and its molecular motions become so slow that $T_2$ (and $T_2^*$) obtains the rigid lattice limit, $T_{1D}$ will still increase with further increases in rigidity. For slower motions, $T_{1D}$ is sensitive to the motions, though $T_2$ is not. $T_{1D}$ may be measured using the well-known Jeener-Broekaert pulse sequence.

Both relaxation times $T_2$ and $T_{1D}$ are easy to measure. They are not sensitive to pulse errors or inhomogeneity of the static field $H_O$. Thus, the measurement of relaxation times to monitor curing is easily transported from the laboratory to a factory setting, an important consideration in assuring the quality of finished cured composite structures in production quantities.

Tests were performed on Tru-Bond "5-minute" epoxy, which may be obtained off the shelf from most any hardware store. The relaxation times $T_2^*$ and $T_{1D}$ were measured as functions of time while the specimen was exposed to a static magnetic field of 17.7 kgauss, and the results are as plotted in FIG. 4. Note that for the first part of the cure cycle (about 10 minutes or less), the value of $T_2^*$ is a good indicator of the increasingly solid-like nature of the sample. In the later part of the cure cycle, the value of $T_2^*$ has reached its rigid lattice value. As shown, $T_{1D}$ continues to increase with further curing.

Figure 5:
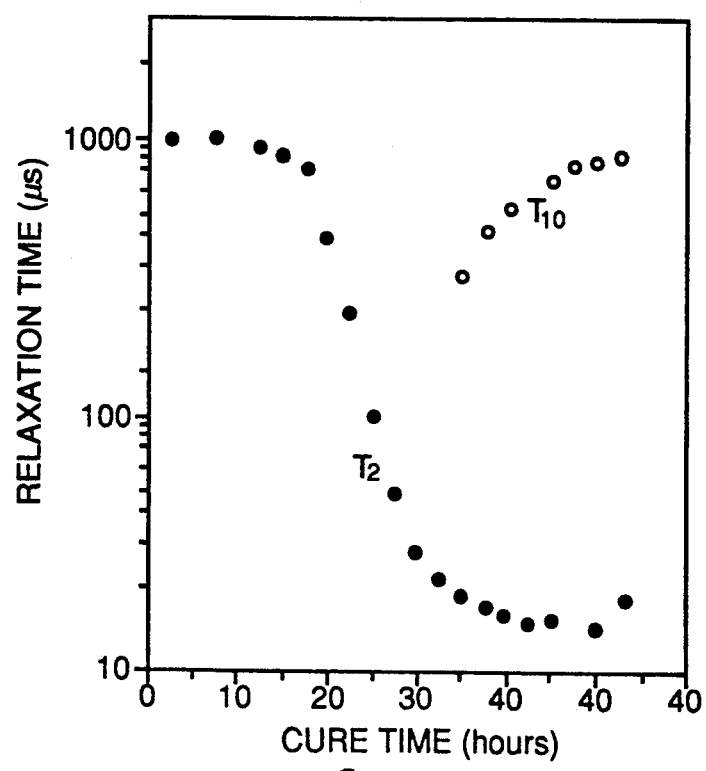
FIG. 5 is a plot of $T_{1D}$ and $T_2^*$ values taken as a time series for Stycast 1266 epoxy during curing while exposed to a 17.7 kgauss static field.

The same measurements were performed for the Stycast 1266 system, available from Emerson and Cuming Co., with the results as shown in FIG. 5. The relaxation times $T_2^*$ and $T_{1D}$ shown in FIG. 5 exhibit the same behavior as for the "5-minute" epoxy except that the reaction is slower, occurring over a period of several hours.

Figure 6:
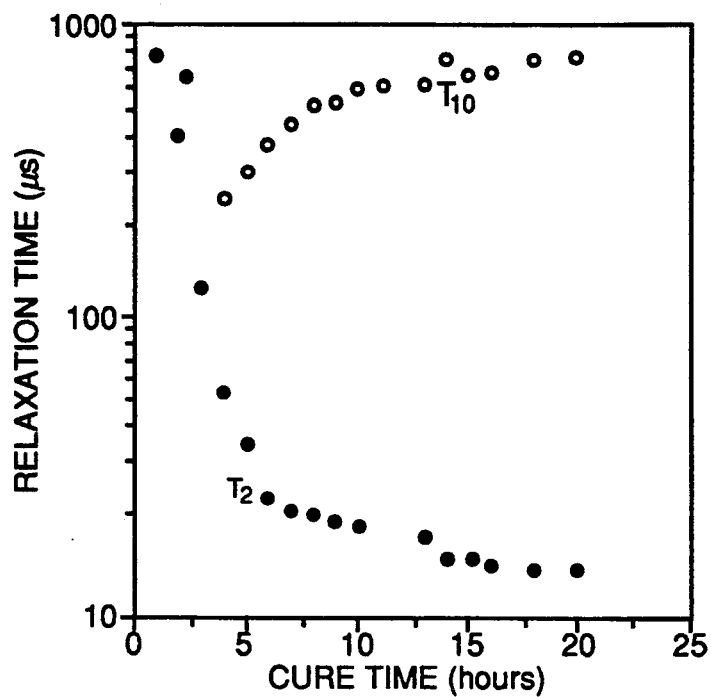
FIG. 6 is a plot of $T_{1D}$ and $T_2^*$ values taken as a time series for Epocast 31A epoxy during curing while exposed to a 17.7 kgauss static field.

A similar set of measurements was performed for the Epocast 31A system, available from Furane Products Co., which produced similar results as presented in FIG. 6.

Thus, the behavior of the relaxations $T_2^*$ and $T_{1D}$ agree with those expected and with each other. The observation of similar changes in all three epoxy systems, though on different curing time scales, demonstrates that the relaxation times are measuring fundamental changes in molecular motions common to all such curing organics. Particular features of the chemistry that might distinguish the three systems are not evident.

The NMR relaxation measurements need not be done in a high field. High field strengths increase the signal to noise ratio, but the epoxy and polyamide systems all have very large densities of protons and the sample volumes are large, so S/N is adequate even at low fields. Further, the cure process is slow, so signal averaging could be used if necessary.

Figure 7:
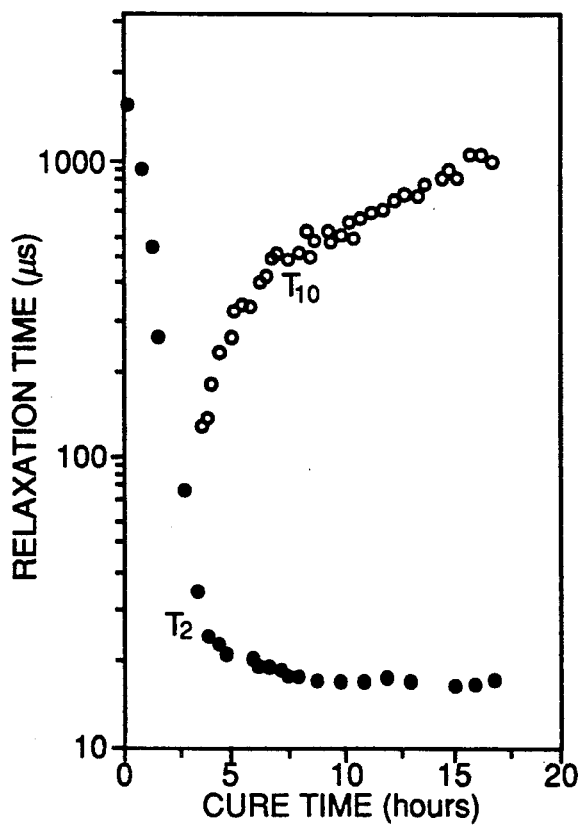
FIG. 7 is a plot of $T_{1D}$ and $T_2^*$ values taken as a time series for Epocast 31A during curing while exposed to a 1.25 kgauss static field.

It is relatively easy to produce a field of ~1250 gauss, even in an autoclave. Thus, to show the feasibility of in situ monitoring, relaxation times were measured as functions of time for the Epocast 31A system at 5.325 MHz (1250 gauss). This is approximately 1/15 the magnetic field strength of the previous measurements. The results are presented in FIG. 7 and are in substantial agreement with the data of FIG. 6 for the same material.

From the above experimental results, it is possible to draw some general observations regarding the use of NMR parameters for monitoring (and controlling) cure states and cure cycles of epoxies used in forming composite structures. Firstly, the dephasing time $T_2^*$ is a good monitor of the early stages of the curing process. As the reaction process, $T_2^*$ decreases from ~1000 $\mu s$ to ~20 $\mu s$, the rigid lattice limit. The measurement of $T_2^*$ is very rapid, requiring only a single free induction decay. Also, the relaxation time $T_{1D}$ of dipolar order is an effective monitor of the later stages of the cure. Once $T_2^*$ has obtained the rigid lattice value, $T_{1D}$ is an increasing function of the progress of the curing reaction, changing from ~200 $\mu s$ to a limiting value of ~700 $\mu s$.

The three epoxy systems described above all show similar changes in $T_2^*$ and $T_{1D}$. The time scales of the changes are different, reflecting the different rates of curing. The similarity of the results suggests that NMR relaxation times can effectively monitor the curing of all or most organic reactive systems. And, the experimental data thus far indicates that the spin-lattice relaxation time $T_1$ does not appear to be a useful monitor of the curing process.

Figure 4:
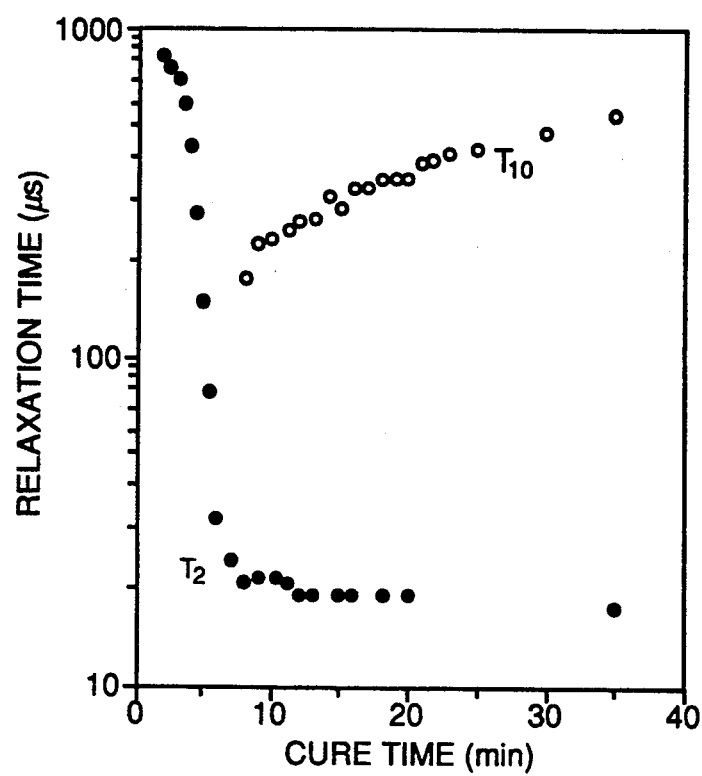
FIG. 4 is a plot of $T_{1D}$ and $T_2^*$ values taken as a time series for "5-minute" epoxy during curing while exposed to a static magnetic field of 17.7 kgauss.

Beyond the basic cure cycle monitoring of the preferred embodiment set forth in FIG. 3, the monitoring information derived via the NMR sensor method is readily expanded to additionally provide cure cycle process control, as shown with reference to FIG. 4. The enhanced preferred embodiment of FIG. 4 includes feedback control of illustrative process variables of cure temperature and pressure, as well as provisions for varying the magnetic field within the curing oven or enclosure. Additionally, the NMR spectrometer may provide its monitoring and control functions responsive to any of a plurality of multiplexed NMR sensors. Suitably selected NMR output information from the enhanced NMR spectrometer 30* is routed via lines 32 to a process control interface unit 34. The interface unit 34 grooms and scales selected output information and routes it via output lines 36 to a temperature controller 38, which controls the temperature within the controllable oven 20*. The interface unit 34 grooms and scales further output information and routes it via output lines 40 to a pressure controller 42, which controls the temperature within the controllable oven 20*. The pressure and pressure control means (not shown) are conventional and well known.

Generally, commercial binder materials, such as PMR-15, are typically cured at temperatures on the order of 350° C. A more detailed description of the temperature and pressure considerations associated with non-invasive cure monitoring apparatus for various types of fiber reinforced composite plastics (using ultrasonic temperature transducers) is given in the aforementioned U.S. Pat. No. 4,921,415 to Thomas, III et al., which is assigned to the same assignee as the present invention and is incorporated by reference herein.

NMR spectrometers exist in a wide variety of types and capabilities. Early devices of the CW or swept CW types gave way to pulsed types, which in turn gave way to devices using complex pulse trains applied around any axis. Additionally, recent NMR spectrometers include a significant amount of automated mode selection, signal processing, and other control and data handling functions, thereby greatly increasing their basic sensitivity and utility. The present invention contemplates use of these more capable spectrometers. Clear teachings of illustrative NMR spectrometry apparatus amenable for use with the present invention are available to an interested reader via U.S. Pat. No. 4,680,547 to Leue et al. issued on Jul. 14, 1987, and also in U.S. Pat. No. 4,677,382 to Vatis issued on Jul. 30, 1987. These patents are assigned to the assignee of the present invention.

Output information from the enhanced NMR spectrometer 30* is further routed via lines 44 to the automatic field control circuitry 28*, thereby providing temporal control of the field intensity within the controllable oven 20*, in addition to the static field intensity control previously described. The NMR sensitive volume around the sensor is determined by the electrical conductivity of the composite material and by the NMR frequency for the nuclei of interest, which is proportional to the strength of the external applied magnetic field. This factor, in addition to others, makes it highly useful to exercise control of the magnetic field applied to the lay-up assembly 18*, which may include a number of embedded NMR sensors. A first sensor or coil pair (not shown) is routed via a first set of lines 24A to a bidirectional multiplexer unit 46. Additional sensors or coil pairs (also not shown) may be routed via additional lines, such as the lines 24N to the multiplexer unit 46, which is interconnected to the enhanced NMR spectrometer 30* via lines 48.

By virtue of the preferred embodiments described, an in-situ nondestructive method for carefully monitoring the instantaneous cure state, or progress of a cure cycle for composite structures is provided. And, by virtue of enhanced embodiments, nondestructive cure cycle monitoring and control methods are readily provided using the teachings of the present inventions. Additional NMR techniques may also be used to detect the presence of entrapped gas bubbles given sufficiently sensitive apparatus, since the relaxation times of nuclei in gas molecules is likely very different from those in the condensed binder material. Another signature of the presence of gas is a shift in the frequency of its NMR signal caused by small differences in the local magnetic field at the nuclei of gas molecules as compared to the field at nuclear sites in the condensed material. A similar shifting of resonance frequency may also be used to monitor the chemical composition of the binder during curing, since the electron distribution of nearby atoms also influences the local magnetic field, and consequently changes in chemical composition could be detected as the binder molecules cross-link and polymerize.

Thus, by providing real-time process control of the primary cure variables, combined with utilizing information from selectively chosen embedded sensors, and providing temporal control of the externally implied magnetic field, highly effective methods for ensuring the quality of finished assemblies and parts fabricated as composite structures are achieved. While the invention has been described in terms of selected preferred embodiments, the invention should not be deemed limited thereto, since other embodiments and modifications will readily occur to one skilled in the art. It is therefore to be understood that the appended claims are intended to call all such modifications as fall within the true spirit and scope of the invention.

What is claimed is:

1. A method of monitoring the cure state of composite structures comprising the steps of:
   (a) embedding an NMR sensor in the interior of an uncured composite structure;
   (b) exposing said uncured composite structure to ambient conditions for curing the composite, and to an externally-applied magnetic field;
   (c) applying signals developed in said sensor to an NMR spectrometer for processing; and
   (d) correlating the cure state of said composite structure with said spectrometer processed signals during exposure of the composite.

2. The method of claim 1 wherein said composite structure is formed of layers and said embedding step comprises embedding a flat NMR sensor coil of conductive material between layers of said composite structure.

3. The method of claim 1 wherein said composite structure comprises a plurality of laminated layers each containing reinforcing fibers surrounded by a matrix impregnated with a resinous binder substance and said embedding step comprises embedding a flat NMR sensor coil between said laminated layers.

4. The method of claim 1 wherein said exposing step is carried out in an enclosed region and said ambient conditions include predetermined temperatures and pressures for effecting a complete cure cycle of said composite structure.

5. The method of claim 1 wherein said spectrometer processing step includes determining values for at least one of the relaxation times $T_1$, $T_2$, $T_{1D}$, $T_2^*$ of the composite structure material in the vicinity of said sensor from which the rigidity of said material may be determined.

6. The method of claim 2 comprising the further step of embedding a second flat coil of conductive material in the vicinity of said flat NMR sensor coil, wherein said second coil serves as excitation means and said sensor coil serves as receiving means for said NMR spectrometer.

7. The method of claim 6 comprising the further step of applying RF energy to said composite structure via said excitation means.

8. The method of claim 3 wherein said spectrometer processing step includes measuring values of at least one of the relaxation times $T_1$, $T_2$, $T_{1D}$, $T_2^*$ of a particular species of nuclei in said binder substance.

9. The method of claim 8 comprising the further step of determining the presence of entrapped gas bubbles in said composite structure during said exposing wherein said spectrometer processing steps include determining a frequency shift in the NMR signals of said sensor correlated to differences in the local magnetic field at the nuclei of gas molecules as compared to the field at nuclear sites of said binder substance.

10. A method of monitoring the cure cycle of composite structures formed as a plurality of laminated layers comprising the steps of:
  (a) embedding at least one flat NMR sensor coil between layers of an uncured composite structure;
  (b) exposing said uncured composite structure to predetermined temperature and pressure conditions for curing it, and simultaneously to an externally-applied magnetic field;
  (c) applying signals developed in said NMR sensor coil to an NMR spectrometer for measurement of at least one of the relaxation times $T_1$, $T_2$, $T_{1D}$, $T_2^*$ of the Composite structure material in the vicinity of said sensor coil; and
  (d) determining the instantaneous cure state of said composite structure during exposing step (b) by correlating the rigidity of said material with the results of said at least one relaxation time measurement.

11. The method of controlling the cure cycle of composite structures comprising the steps of:
  (a) embedding an NMR sensor in the interior of an uncured composite structure;
  (b) exposing said uncured composite structure to controlled temperature and pressure and to an externally-applied magnetic field during said cure cycle;
  (c) applying signals developed in said NMR sensor to an NMR spectrometer for processing, said spectrometer processed signal including measure values of at least one of the relaxation times $T_1$, $T_2$, $T_{1D}$, $T_2^*$ of the composite structure material in the vicinity of said sensor; and
  (d) utilizing said spectrometer processed signals to control said temperature and pressure, thereby controlling said cure cycle responsive in part to said sensor developed signals.

12. The method of claim 11, wherein said composite structure is formed of layers and said embedding step further comprises embedding a flat NMR sensor coil of conductive material between the layers of said composite structure.

13. The method of claim 12 comprising the further step of embedding a second flat coil of conductive material in the vicinity of said flat NMR sensor coil, wherein said second coil serves as excitation means and said sensor coil serves as receiving means for said NMR spectrometer.

14. The method of claim 11, wherein said composite structure comprises a plurality of laminated layers each containing reinforcing fibers surrounded by a matrix impregnated with a resinous binder substance and said embedding step comprises embedding said flat NMR sensor coil between said laminated layers.

15. The method of claim 11, wherein said spectrometer processing step includes measuring values of at least one of the relaxation times $T_1$, $T_2$, $T_{1D}$, $T_2^*$ of a particular species of nuclei in said binder substance.

16. Apparatus for monitoring the cure state of composite structures comprising:
  (a) an NMR sensor embedded in the interior of an uncured composite structure;
  (b) means for exposing said uncured composite structure to controlled ambient conditions for curing it and means for simultaneously applying an external magnetic field to said uncured composite structure; and
  (c) an NMR spectrometer connected to said NMR sensor for processing signals developed in said sensor, such that the cured state of said composite structure may be correlated with said spectrometer processed signals during exposure of the composite.

17. The apparatus of claim 16 wherein the composite structure is formed of layers and said NMR sensor comprises at least one flat coil of conductive material embedded between selected layers.

18. The apparatus of claim 17 further comprising a second flat coil of conductive material embedded in the vicinity of said flat NMR sensor coil to form an interactive pair wherein said second coil serves as the excitation means and said sensor coil serves as the receiving means for said NMR spectrometer.

19. The apparatus of claim 18 further comprising two or more interactive pairs of coils that are multiplexed to said NMR spectrometer.

20. The apparatus of claim 16 wherein said means for exposing comprise:
  (a) an enclosure for containing said composite structure;
  (b) a temperature controller for controlling the temperature in said enclosure;
  (c) a pressure controller for controlling the pressure ins aid enclosure; and
  (d) said means for applying an external magnetic field comprise a coil surrounding said composite structure.

21. Apparatus for monitoring and controlling the cure cycle of composite structures formed as a plurality of laminated layers, comprising:
  (a) at least one NMR sensor embedded between selected layers of an uncured composite structure;
  (b) means for exposing said uncured composite structure to controlled ambient conditions for curing it and means for simultaneously applying an external magnetic field to said uncured composite structure;
  (c) an NMR spectrometer for processing signals derived from said at least one sensor whereby the cured state of said composite structure may be correlated with said spectrometer processed signals during exposure of the composite; and
  (d) feedback control mans for controlling said ambient conditions responsive in part to said spectrometer processed signals whereby the cure cycle of said composite structure may be completed.

22. The apparatus of claim 21 wherein said at least one NMR sensor comprises a flat NMR sensor coil of conductive material.

23. The apparatus of claim 22 further comprising a second flat coil of conductive material embedded in the vicinity of said flat NMR sensor coil to form an interactive pair wherein said second coil serves as excitation means and said sensor coil serves as receiving means for said NMR spectrometer.

24. The apparatus of claim 23 further comprising two or more interactive pairs of coils that are multiplexed to said NMR spectrometer.

25. The apparatus of claim 21 wherein said means for exposing comprise an enclosure for containing said uncured composite structure and said feedback control means comprise:
  (a) a temperature controller responsive in part to said spectrometer processed signals for setting the ambient temperature in said enclosure;
  (b) a pressure controller responsive in part to said spectrometer processed signals for setting the ambient pressure in said enclosure; and
  (c) said means for applying an external magnetic field comprise a coil surrounding said composite structure, the intensity of said applied magnetic field responsive in part to said spectrometer processed signals.

26. A method of monitoring the cure state of composite structures comprising the steps of:
  (a) embedding an NMR sensor in the interior of an uncured composite structure;
  (b) exposing said uncured composite structure to ambient conditions for curing the composite, and to at least one externally-applied magnetic field;
  (c) applying signals developed in said sensor to an NMR spectrometer to determine values for at least one of the relaxation times $T_{1D}$, $T_2$, $T_2^*$; and
  (d) correlating the cure state of said composite structure with said at least one relaxation time value determined during exposure of the composite.

27. The method of claim 26 wherein said applying step (c) includes determining values for both $T_{1D}$ and $T_2^*$ and said correlating step (d) includes consideration of both $T_{1D}$ and $T_2^*$ values.

28. The method of claim 26 wherein said at least one externally-applied magnetic field includes a static magnetic field and two or more magnetic pulses in a predetermined pulse sequence to determine values for $T_{1D}$.

29. The method of claim 28 wherein said predetermined pulse sequence is a Jeener-Broekaert pulse sequence.

30. The method of claim 29 wherein the composite is an epoxy.

31. The method of claim 28 wherein the intensity of said externally applied static magnetic field lies within the range of 0.75 kgauss and 20 kgauss.

32. A method of monitoring the cure cycle of composite structures comprising the steps of:
  (a) embedding an NMR sensor in the interior of an uncured composite structure;
  (b) exposing said uncured composite structure to ambient conditions for curing the composite, and to at least one externally-applied magnetic field;
  (c) applying signals developed in said sensor to an NMR spectrometer for determining a time series of values for at least one of the relaxation times $T_{1D}$, $T_2$, $T_2^*$; and
  (d) correlating the cure cycle of said composite structure with said time series of values determined during exposure of the composite.

33. The method of claim 32 wherein said applying step (c) determines said time series of values for both $T_{1D}$ and $T_2^*$ and said correlating step (d) includes consideration of said time series of both $T_{1D}$ and $T_2^*$ values.

34. The method of claim 33 wherein said at least one externally-applied magnetic field includes a static magnetic field and two or more magnetically pulsed fields in a predetermined pulse sequence to determine values for $T_{1D}$.

35. The method of claim 34 wherein said predetermined pulse sequence is a Jeener-Broekaert pulse sequence.

36. The method of claim 28 wherein said externally applied static magnetic field has intensities within the range of 0.75 kgauss and 20 kgauss.

37. The method of claim 32 wherein the composite structure is an epoxy.

38. The method of claim 34 wherein said externally applied static magnetic field has intensities within the range of 0.75 kgauss and 20 kgauss.

* * * * *